(12) United States Patent
Hsieh et al.

(10) Patent No.: US 8,796,824 B1
(45) Date of Patent: Aug. 5, 2014

(54) SEMICONDUCTOR STRUCTURE

(71) Applicant: Chipbond Technology Corporation, Hsinchu (TW)

(72) Inventors: Chin-Tang Hsieh, Kaohsiung (TW); Shyh-Jen Guo, Hsinchu (TW); You-Ming Hsu, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 14/014,568

(22) Filed: Aug. 30, 2013

(30) Foreign Application Priority Data

Aug. 2, 2013 (TW) .............................. 102127697 U (51) Int. Cl.
| | |
|---|---|
| *H01L 23/58* | (2006.01) |
| *H01L 29/06* | (2006.01) |
| *H01L 23/00* | (2006.01) |
| *H01L 23/28* | (2006.01) |
| *H01L 23/532* | (2006.01) |

(52) U.S. Cl.
CPC .............. *H01L 23/562* (2013.01); *H01L 23/28* (2013.01); *H01L 23/53295* (2013.01)
USPC ............................ 257/637; 257/626; 257/669

(58) Field of Classification Search
CPC ....... H01L 23/02; H01L 23/28; H01L 23/562; H01L 23/53295
USPC .......................................... 257/626, 637, 669
See application file for complete search history.

(56) References Cited

U.S. PATENT DOCUMENTS

| | | | |
|---|---|---|---|
| 7,867,825 B2 * | 1/2011 | Kim et al. ..................... | 438/113 |
| 8,692,357 B2 * | 4/2014 | Ning .............................. | 257/620 |
| 2011/0215447 A1 * | 9/2011 | Furusawa et al. ............. | 257/637 |

* cited by examiner

*Primary Examiner* — Hung Vu
(74) *Attorney, Agent, or Firm* — Jackson IPG PLLC (57) ABSTRACT

A semiconductor structure having a first corner includes a carrier, a first protective layer, a second protective layer, and a third protective layer. The carrier comprises a carrier surface having a protection-layered disposing zone. The first protective layer comprises a first surface having a first disposing zone, a first anti-stress zone and a first exposing zone, the first anti-stress zone is located at a corner of the first disposing zone, the second protective layer is disposed at the first disposing zone. The second protective layer comprises a second surface having a second disposing zone, a second anti-stress zone and a second exposing zone, the second anti-stress zone is located at a corner of the second disposing zone. The first anti-stress zone and the second anti-stress zone are located at the first corner. An area of the first anti-stress zone is not smaller than that of the second anti-stress zone.

15 Claims, 7 Drawing Sheets

SEMICONDUCTOR STRUCTURE

FIELD OF THE INVENTION

The present invention is generally related to a semiconductor structure, which particularly relates to the semiconductor structure for preventing the stress from concentrating on a corner of the semiconductor structure.

BACKGROUND OF THE INVENTION

Figure 7:
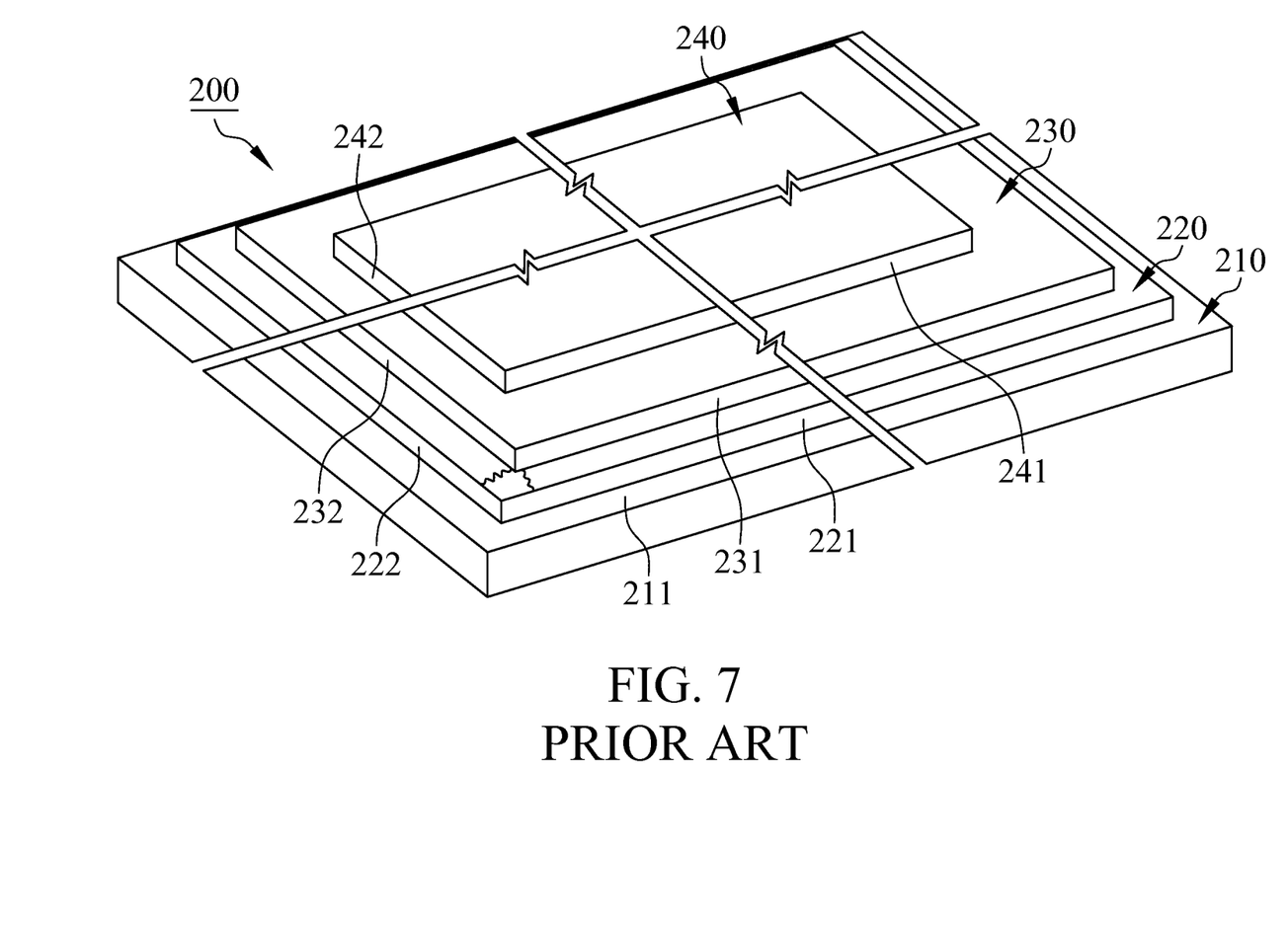
FIG. 7 is a perspective view of a conventional semiconductor structure.

A conventional semiconductor structure 200 illustrated in FIG. 7 comprises a carrier 210, a first protective layer 220, a second protective layer 230 and a third protective layer 240. The carrier 210 comprises a surface 211, and the first protective layer 220 is disposed on the surface 211. The first protective layer 220 comprises a first lateral wall 221 and a second lateral wall 222 connected to the first lateral wall 222. The second protective layer 230 is disposed on the first protective layer 220 and comprises a third lateral wall 231 and a fourth lateral wall 232 connected to the third lateral wall 231. The third protective layer 240 is disposed on the second protective layer 230 and comprises a fifth lateral wall 241 and a sixth lateral wall 242 connected to the fifth lateral wall 241. In conventional semiconductor structure 200, the first protective layer 220, the second protective layer 230 and the third protective layer 240 are differed at size. Besides, a connection portion connected to the third lateral wall 231 and the fourth lateral wall 232 of the second protective layer 230 forms a right angle, and another connection portion connected to the fifth lateral wall 241 and the sixth lateral wall 242 of the third protective layer 240 forms a right angle as well. For the following reasons, when the first protective layer 220, the second protective layer 230 and the third protective layer 240 are disposed on the surface 211 of the carrier 210, the stress likely concentrates on the connection portion connected to the third lateral wall 231 and the fourth lateral wall 232 to make the connection portion cracked or separated therefore lowering the production yield of the semiconductor structure 200.

SUMMARY

The primary object of the present invention is to provide a semiconductor structure. An anti-stress zone of a surface of each protective layer prevents the stress from concentrating on a corner of each protective layer to avoid cracks or separations occurred in the semiconductor structure.

A semiconductor structure having a first corner and a second corner includes a carrier, a first protective layer, a second protective layer, and a third protective layer. The carrier comprises a carrier surface having a protection-layered disposing zone and a protection-layered exposing zone located outside the protection-layered disposing zone. The first protective layer is disposed at the protection-layered disposing zone and comprises a first surface having a first disposing zone, at least one first anti-stress zone and a first exposing zone located outside the first disposing zone and the at least one first anti-stress zone, and the at least one first anti-stress zone is located at a corner of the first disposing zone. The second protective layer is disposed at the first disposing zone and reveals the at least one first anti-stress zone and the first exposing zone, the second protective layer comprises a second surface having a second disposing zone, at least one second anti-stress zone and a second exposing zone located outside the second disposing zone and the at least one second anti-stress zone, the at least one second anti-stress zone is located at a corner of the second disposing zone. The third protective layer is disposed at the second disposing zone and reveals the at least one second anti-stress zone and the second exposing zone, the at least one first anti-stress zone and the at least one second anti-stress zone are located at the first corner, and an area of the at least one first anti-stress zone is not smaller than an area of the at least one second anti-stress zone. For the first protective layer possessing the at least one first anti-stress zone and the second protective layer possessing the at least one second anti-stress zone, the stress of the semiconductor structure does not concentrate on the first corner so that the possible cracks or separation from the first corner can be avoided therefore raising the production yield of the semiconductor structure.

DETAILED DESCRIPTION OF THE INVENTION

Figure 1:
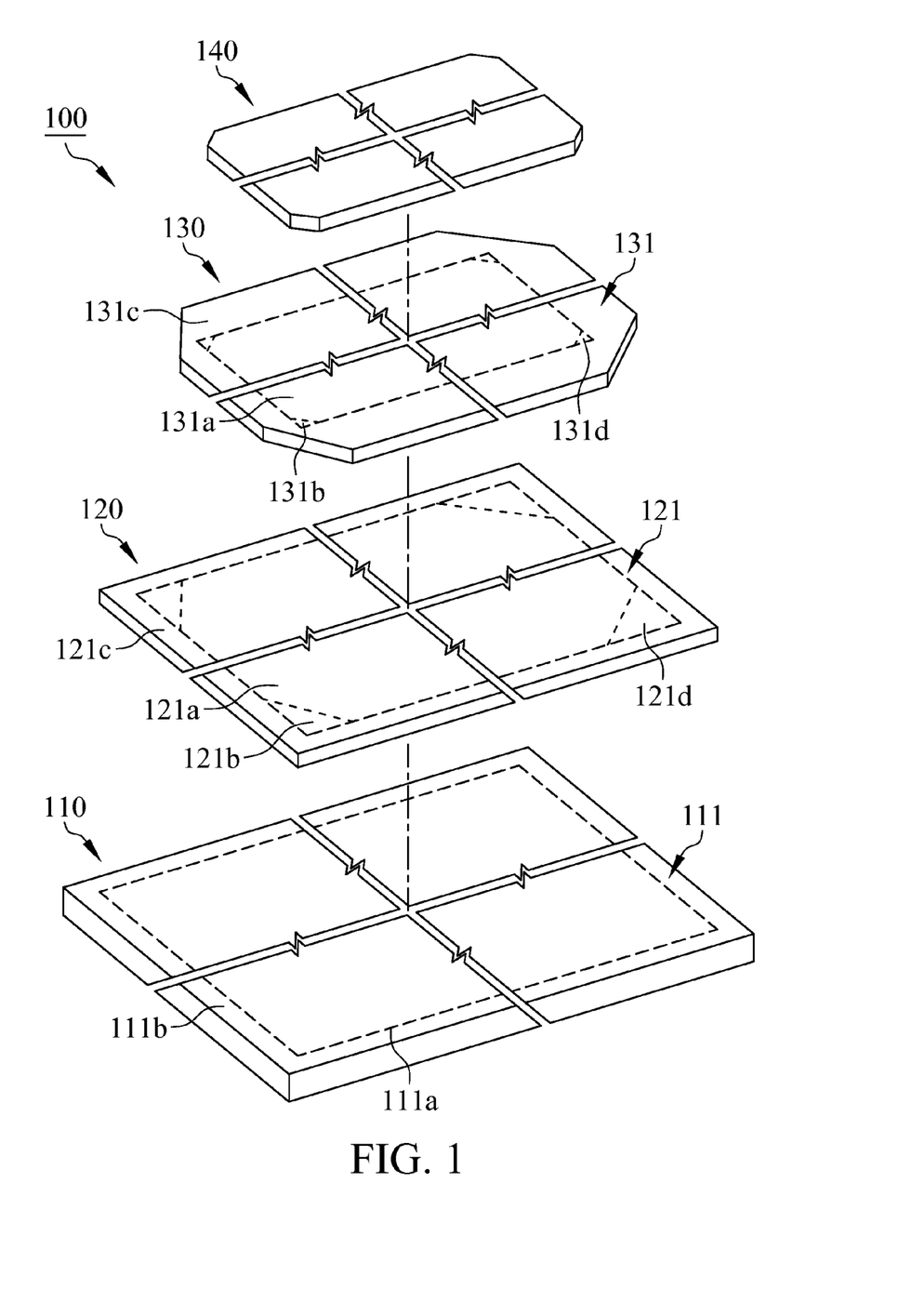
FIG. 1 is a perspective exploded view illustrating a semiconductor structure in accordance with a first embodiment of the present invention.
Figure 2:
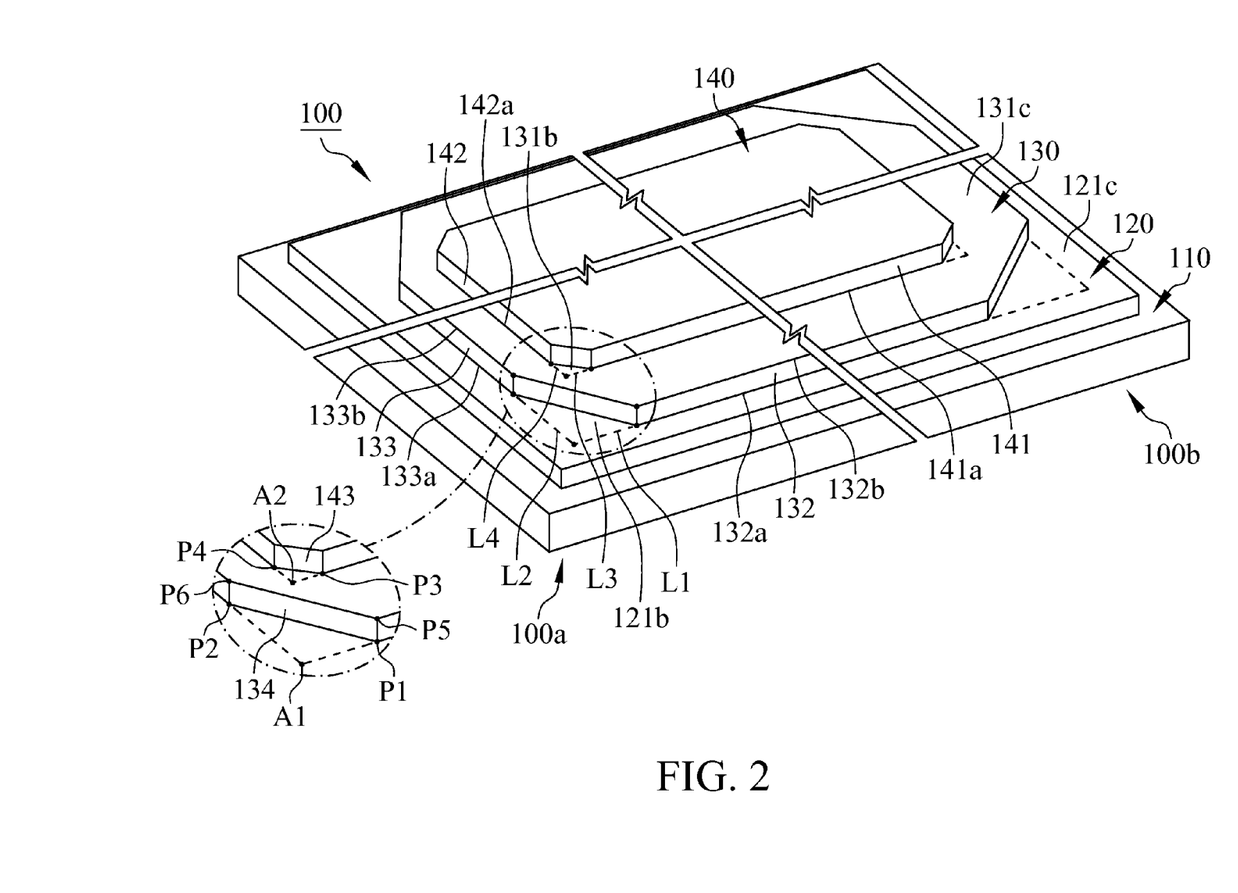
FIG. 2 is a perspective view illustrating the semiconductor structure in accordance with a first embodiment of the present invention.

With reference to FIGS. 1 and 2, a semiconductor structure 100 in accordance with a first embodiment of the present invention comprises a first corner 100a and a second corner 100b. The semiconductor structure 100 includes a carrier 110, a first protective layer 120, a second protective layer 130, and a third protective layer 140. The carrier 110 comprises a carrier surface 111 having a protection-layered disposing zone 111a and a protection-layered exposing zone 111b located outside the protection-layered disposing zone 111a. The first protective layer 120 is disposed at the protection-layered disposing zone 111a and comprises a first surface 121 having a first disposing zone 121a, at least one first anti-stress zone 121b and a first exposing zone 121c located outside the first disposing zone 121a and the at least one first anti-stress zone 121b. The at least one first anti-stress zone 121b is located at a corner of the first disposing zone 121a. The second protective layer 130 is disposed at the first disposing zone 121a and reveals the at least one first anti-stress zone 121b and the first exposing zone 121c, and the second protective layer 130 comprises a second surface 131 having a second disposing zone 131a, at least one second anti-stress zone 131b and a second exposing zone 131c located outside the second disposing zone 131a and the at least one second anti-stress zone 131b. The second anti-stress zone 131b is located at a corner of the second disposing zone 131a.

Figure 3:
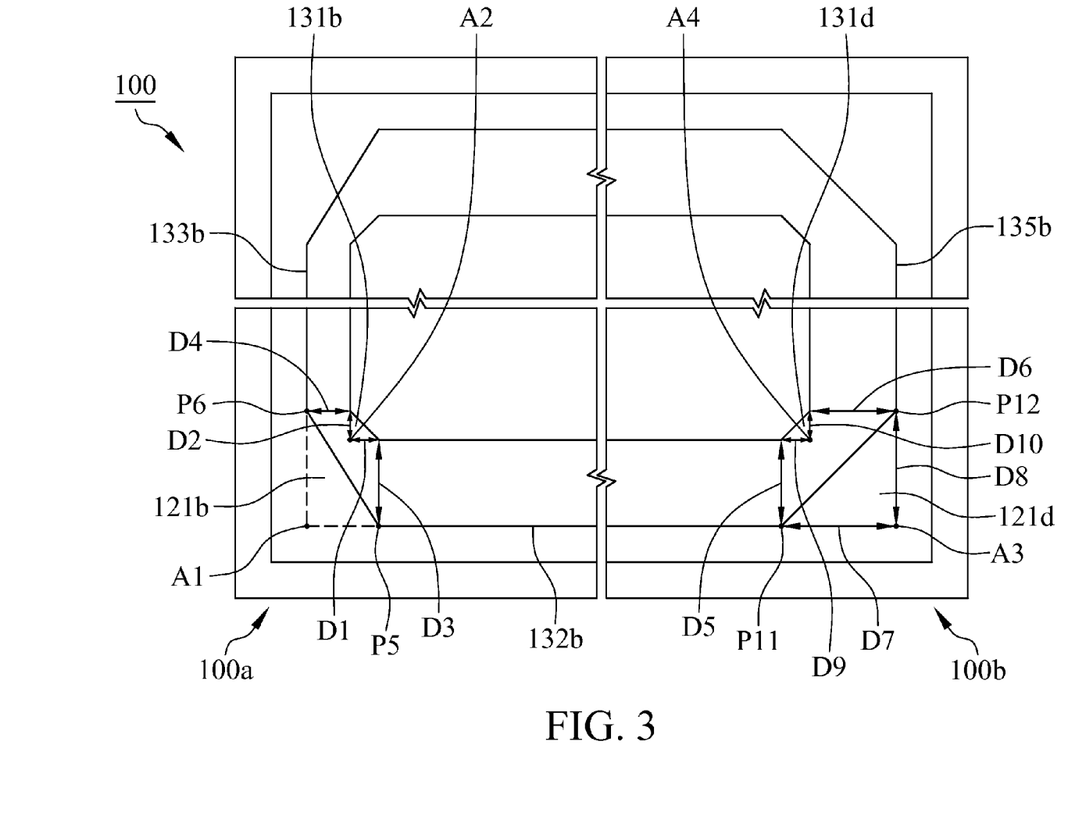
FIG. 3 is a top view illustrating the semiconductor structure in accordance with a first embodiment of the present invention.

With reference to FIGS. 2 and 3, the second protective layer 130 comprises a first lateral wall 132, a second lateral wall 133 and a first connection wall 134 connected to the first lateral wall 132 and the second lateral wall 133. The first lateral wall 132 comprises a first bottom edge 132a having a first point P1, and the second lateral wall 133 comprises a second bottom edge 133a having a second point P2. A first extension line L1 extendedly formed from the first point P1 of the first bottom edge 132a and a second extension line L2 extendedly formed from the second point P2 of the second bottom edge 133a intersect each other to form a first base point A1. A zone formed by connecting the first base point A1, the first point P1 and the second point P2 is the at least one first anti-stress zone 121b. In this embodiment, the first connection wall 134 is a flat surface.

With reference to FIGS. 1, 2 and 3, the third protective layer 140 is disposed at the second disposing zone 131a and reveals the at least one second anti-stress zone 131b and a second exposing zone 131c, the at least one first anti-stress zone 121b and the at least one second anti-stress zone 131b are located at the first corner 100a, and an area of the at least one first anti-stress zone 121b is not smaller than an area of the at least one second anti-stress zone 131b. In this embodiment, the third protective layer 140 comprises a third lateral wall 141, a fourth lateral wall 142 and a second connection wall 143 connected to the third lateral wall 141 and the fourth lateral wall 142. The third lateral wall 141 comprises a third bottom edge 141a having a third point P3, and the fourth lateral wall 142 comprises a fourth bottom edge 142a having a fourth point P4. A third extension line L3 extendedly formed from the third point P3 of the third bottom edge 141a and a fourth extension line L4 extendedly formed from the fourth point P4 of the fourth bottom edge 142a intersect each other to form a second base point A2. Besides, a zone formed by connecting the second base point A2, the third point P3 and the fourth point P4 is the at least one second anti-stress zone 131b, and the second connection wall 143 is a flat surface. The second base point A2 and the third point P3 are spaced apart by a first distance D1, The second base point A2 and the fourth point P4 are spaced apart by a second distance D2 that is equal to the first distance D1.

With reference to FIGS. 2 and 3, in this embodiment, the first lateral wall 132 of the second protective layer 130 further comprises a first top edge 132b having a fifth point P5, and the second lateral wall 133 further comprises a second top edge 133b having a sixth point P6. The fifth point P5 and the third point P3 are spaced apart by a third distance D3, and the third distance D3 is the shortest distance from the first top edge 132b to the third bottom edge 141a. The sixth point P6 and the fourth point P4 are spaced apart by a fourth distance D4, and the fourth distance D4 is the shortest distance from the second top edge 133b to the fourth bottom edge 142a.

Figure 4:
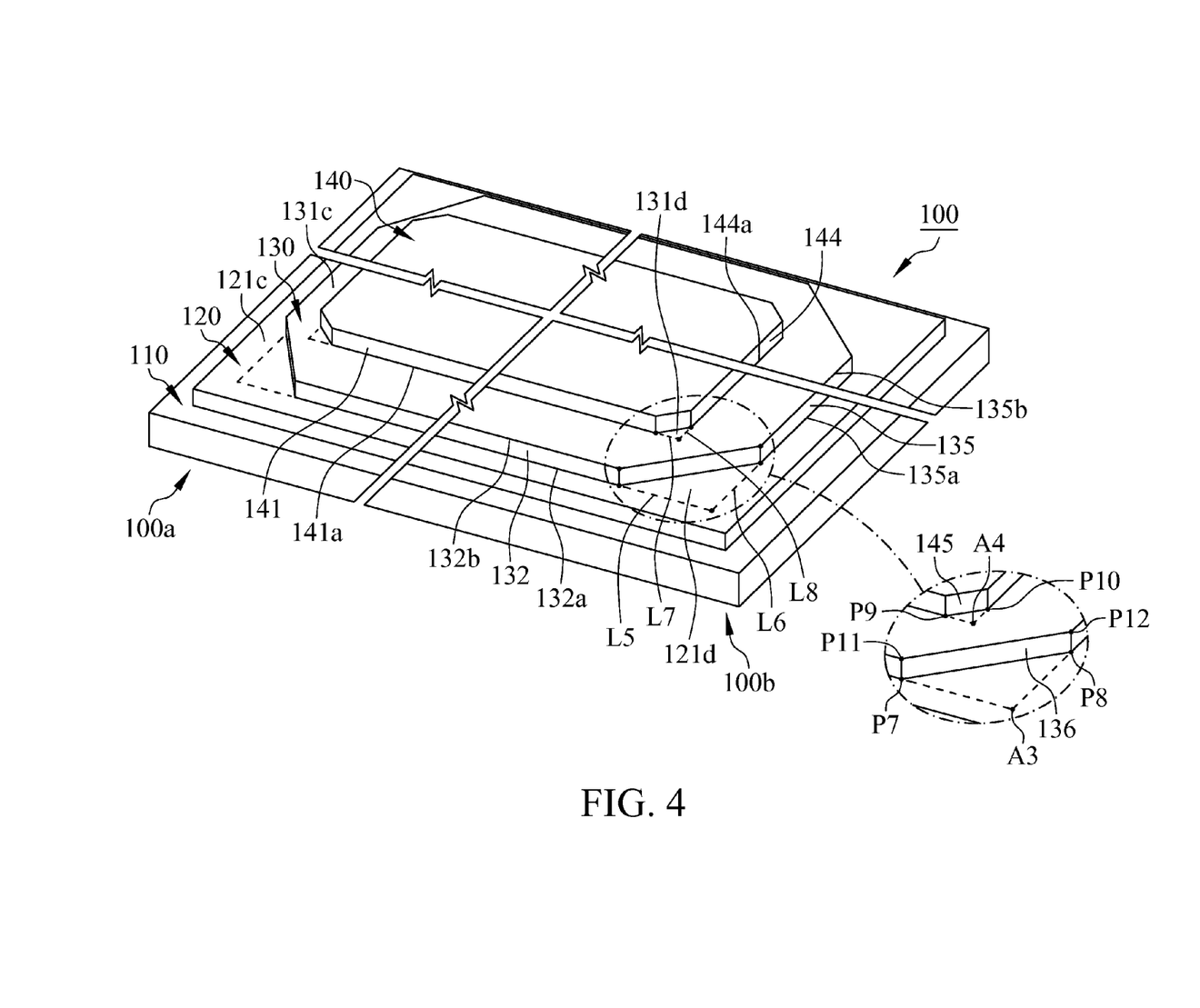
FIG. 4 is another perspective view illustrating the semiconductor structure in accordance with a first embodiment of the present invention.

With reference to FIGS. 1 and 4, the first surface 121 of the first protective layer 120 further comprises at least one third anti-stress zone 121d located at another corner of the first disposing zone 121a. The second protective layer 130 reveals the at least one third anti-stress zone 121d, the second surface 131 of the second protective layer 130 comprises at least one fourth anti-stress zone 131d located at another corner of the second disposing zone 131a. The third protective layer 140 reveals the at least one fourth anti-stress zone 131d. The at least one third anti-stress zone 121d and the at least one fourth anti-stress zone 131d are located at the second corner 100b, and an area of the at least one third anti-stress zone 121d is not smaller than an area of the at least one fourth anti-stress zone 131d. Referring to FIGS. 3 and 4, the second protective layer 130 further comprises a fifth lateral wall 135 and a third connection wall 136 connected to the first lateral wall 132 and the fifth lateral wall 135, the first bottom edge 132a of the first lateral wall 132 comprises a seventh point P7, and the fifth lateral wall 135 comprises a fifth bottom edge 135a having an eighth point P8. A fifth extension line L5 extendedly formed from the seventh point P7 of the first bottom edge 132a and a sixth extension line L6 extendedly formed from the eighth point P8 of the fifth bottom edge 135a intersect each other to form a third base point A3, and a zone formed by connecting the third base point A3, the seventh point P7 and the eighth point P8 is the at least one third anti-stress zone 121d. In this embodiment, the third connection wall 136 is a flat surface.

With reference to FIGS. 3 and 4, the third protective layer 140 further comprises a sixth lateral wall 144 and a fourth connection wall 145 connected to the third lateral wall 141 and the sixth lateral wall 144. The third bottom edge 141a of the third lateral wall 141 comprises a ninth point P9, and the sixth lateral wall 144 comprises a sixth bottom edge 144a having a tenth point P10. A seventh extension line L7 extendedly formed from the ninth point P9 of the third bottom edge 141a and an eighth extension line L8 extendedly formed from the tenth point P10 of the sixth bottom edge 144a intersect each other to form a fourth base point A4, and a zone formed by connecting the fourth base point A4, the ninth point P9 and the tenth point P10 is the at least one fourth anti-stress zone 131d. In this embodiment, the fourth connection wall 145 is a flat surface.

With reference to FIGS. 3 and 4 again, the first top edge 132b of the first lateral wall 132 of the second protective layer 130 comprises an eleventh point P11, the fifth lateral wall 135 comprises a third top edge 135b having a twelfth point P12, wherein the eleventh point P11 and the ninth point P9 are spaced apart by a fifth distance D5, the twelfth point P12 and the tenth point P10 are spaced apart by a sixth distance D6, the fifth distance D5 is the shortest distance from the first top edge 132b to the third bottom edge 141a, and the sixth distance D6 is the shortest distance from the third top edge 135b to the sixth bottom edge 144a. Besides, in this embodiment, the third base point A3 and the seventh point P7 are spaced apart by a seventh distance D7, and the third base point A3 and the eighth point P8 are spaced apart by an eighth distance D8 that is equal to the seventh distance D7. The fourth base point A4 and the ninth point P9 are spaced apart by a ninth distance D9, and the fourth base point A4 and the tenth point P10 are spaced apart by a tenth distance D10 that is equal to the ninth distance D9.

In this invention, the at least one first anti-stress zone 121b and the at least one second anti-stress zone 131b are located at the first corner 100a, the at least one third anti-stress zone 121d and the at least one fourth anti-stress zone 131d are located at the second corner 100b, mentioned features prevent the stress from concentrating on the first corner 100a and the second corner 100b. In addition, the first connection wall 134, the third connection wall 136 of the second protective layer 130, the second connection wall 143 and the fourth connection wall 145 of the third protective layer 140 also possess the function for preventing the stress from concentrating on the corners. The cracks or separations likely occurred at the first corner 100a or the second corner 100b can be avoided therefore raising the production yield of the semiconductor structure 100.

Figure 5:
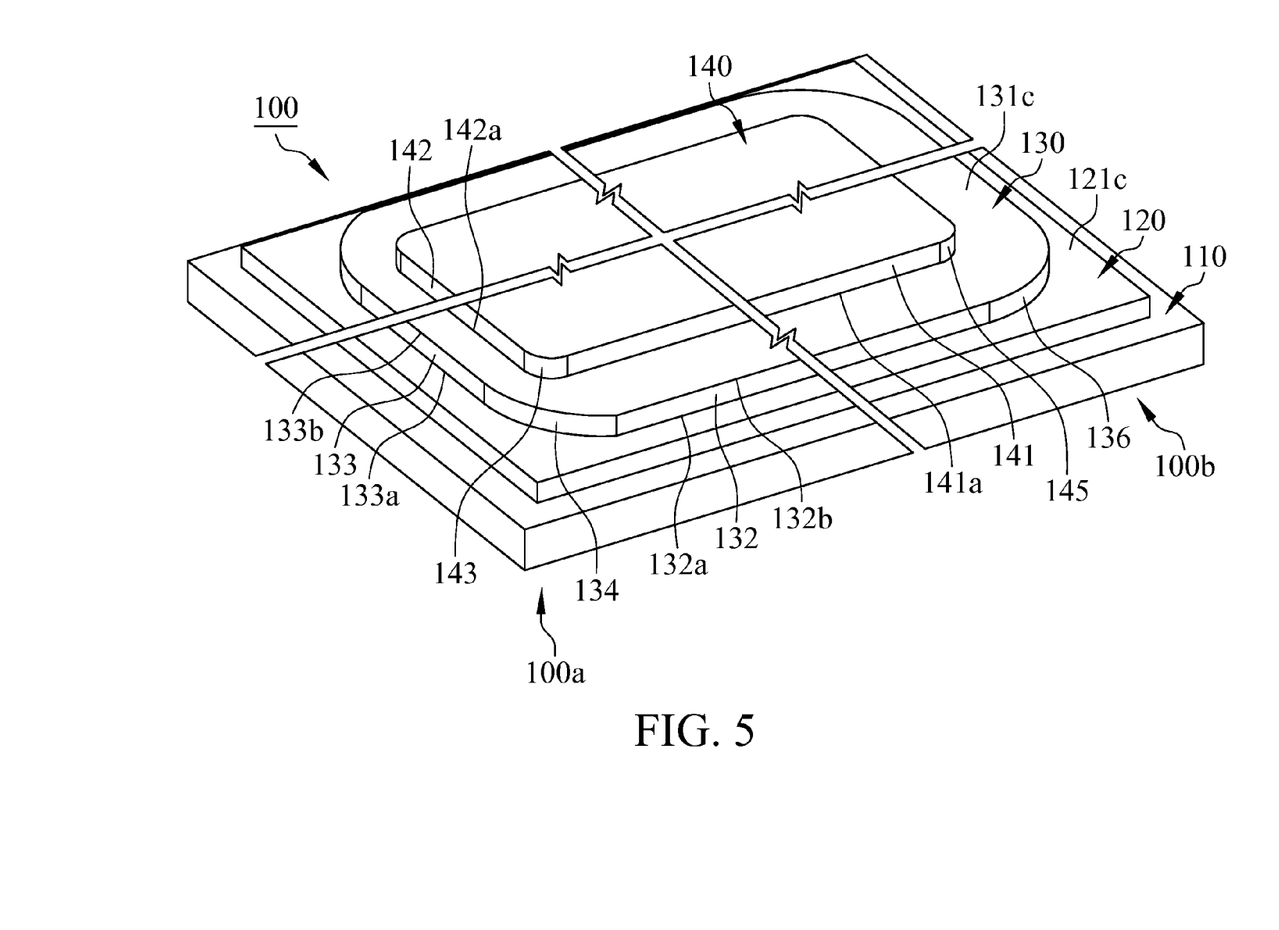
FIG. 5 is a perspective view illustrating a semiconductor structure in accordance with a second embodiment of the present invention.
Figure 6:
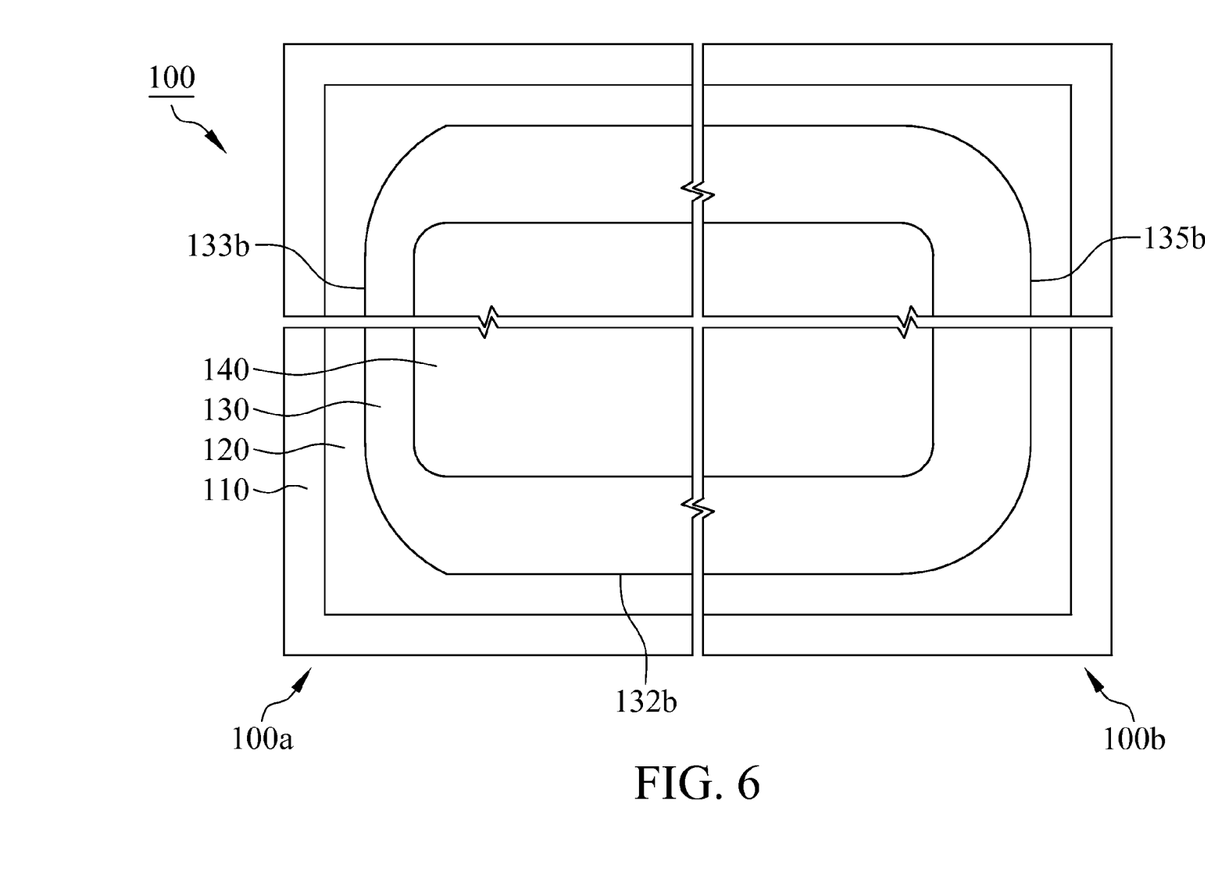
FIG. 6 is a perspective view illustrating the semiconductor structure in accordance with a second embodiment of the present invention.

FIGS. 5 and 6 illustrate a second embodiment of the present invention, the primary difference between the second embodiment and the first embodiment is that the first connection wall 134, the second connection wall 143, the third connection wall 136 and the fourth connection wall 145 are arc surfaces. The arc surfaces of the first connection wall 134, the second connection wall 143, the third connection wall 136 and the fourth connection wall 145 prevent the stress of the semiconductor structure 100 from concentrating on a connection portion (adjacent to the first corner 100a) between the first lateral wall 132 and the second lateral wall 133 of the second protective layer 130 so as to avoid cracks or separations likely occurred at the connection portion between the first lateral wall 132 and the second lateral wall 133.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A semiconductor structure having a first corner and a second corner includes:
   a carrier having a carrier surface, the carrier surface comprises a protection-layered disposing zone and a protection-layered exposing zone located outside the protection-layered disposing zone;
   a first protective layer disposed at the protection-layered disposing zone and having a first surface, the first surface comprises a first disposing zone, at least one first anti-stress zone and a first exposing zone located outside the first disposing zone and the at least one first anti-stress zone, the at least one first anti-stress zone is located at a corner of the first disposing zone;
   a second protective layer disposed at the first disposing zone and revealing the at least one first anti-stress zone and the first exposing zone, the second protective layer comprises a second surface having a second disposing zone, at least one second anti-stress zone and a second exposing zone located outside the second disposing zone and the at least one second anti-stress zone, the at least one second anti-stress zone is located at a corner of the second disposing zone; and
   a third protective layer disposed at the second disposing zone and revealing the at least one second anti-stress zone and the second exposing zone, the at least one first anti-stress zone and the at least one second anti-stress zone are located at the first corner, an area of the at least one first anti-stress zone is not smaller than an area of the at least one second anti-stress zone.

2. The semiconductor structure in accordance with claim 1, wherein the second protective layer comprises a first lateral wall, a second lateral wall and a first connection wall connected to the first lateral wall and the second lateral wall, the first lateral wall comprises a first bottom edge having a first point, the second lateral wall comprises a second bottom edge having a second point, wherein a first extension line extendedly formed from the first point of the first bottom edge and a second extension line extendedly formed from the second point of the second bottom edge intersect each other to form a first base point, and a zone formed by connecting the first base point, the first point and the second point is the at least one first anti-stress zone.

3. The semiconductor structure in accordance with claim 2, wherein the first connection wall is a flat surface or an arc surface.

4. The semiconductor structure in accordance with claim 1, wherein the third protective layer comprises a third lateral wall, a fourth lateral wall and a second connection wall connected to the third lateral wall and the fourth lateral wall, the third lateral wall comprises a third bottom edge having a third point, the fourth lateral wall comprises a fourth bottom edge having a fourth point, wherein a third extension line extendedly formed from the third point of the third bottom edge and a fourth extension line extendedly formed from the fourth point of the fourth bottom edge intersect each other to form a second base point, and a zone formed by connecting the second base point, the third point and the fourth point is the at least one second anti-stress zone.

5. The semiconductor structure in accordance with claim 4, wherein the second base point and the third point are spaced apart by a first distance, the second base point and the fourth point are spaced apart by a second distance equal to the first distance.

6. The semiconductor structure in accordance with claim 4, wherein the second protective layer comprises a first lateral wall, a second lateral wall and a first connection wall connected to the first lateral wall and the second lateral wall, the first lateral wall comprises a first top edge having a fifth point, the second lateral wall comprises a second top edge having a sixth point, the fifth point and the third point are spaced apart by a third distance, the sixth point and the fourth point are spaced apart by a fourth distance, the third distance is the shortest distance from the first top edge to the third bottom edge, and the fourth distance is the shortest distance from the second top edge to the fourth bottom edge.

7. The semiconductor structure in accordance with claim 4, wherein the second connection wall is a flat surface or an arc surface.

8. The semiconductor structure in accordance with claim 1, wherein the first surface of the first protective layer comprises at least one third anti-stress zone located at another corner of the first disposing zone, the second protective layer reveals the at least one third anti-stress zone, the second surface of the second protective layer comprises at least one fourth anti-stress zone, the at least one fourth anti-stress zone is located at another corner of the second disposing zone, the third protective layer reveals the at least one fourth anti-stress zone, the at least one third anti-stress zone and the at least one fourth anti-stress zone are located at the second corner, and an area of the at least one third anti-stress zone is not smaller than an area of the at least one fourth anti-stress zone.

9. The semiconductor structure in accordance with claim 8, wherein the second protective layer comprises a first lateral wall, a fifth lateral wall and a third connection wall connected to the first lateral wall and the fifth lateral wall, the first lateral wall comprises a first bottom edge having a seventh point, the fifth lateral wall comprises a fifth bottom edge having an eighth point, wherein a fifth extension line extendedly formed from the seven point of the first bottom edge and a sixth extension line extendedly formed from the eighth point of the fifth bottom edge intersect each other to form a third base point, and a zone formed by connecting the third base point, the seventh point and the eighth point is the at least one third anti-stress zone.

10. The semiconductor structure in accordance with claim 9, wherein the third base point and the seventh point are spaced apart by a seventh distance, the third base point and the eighth point are spaced apart by an eighth distance equal to the seventh distance.

11. The semiconductor structure in accordance with claim 9, wherein the third connection wall is a flat surface or an arc surface.

12. The semiconductor structure in accordance with claim 8, wherein the third protective layer comprises a third lateral wall, a sixth lateral wall and a fourth connection wall connected to the third lateral wall and the sixth lateral wall, the third lateral wall comprises a third bottom edge having a ninth point, the sixth lateral wall comprises a sixth bottom edge having a tenth point, wherein a seventh extension line extendedly formed from the ninth point of the third bottom edge and an eighth extension line extendedly formed from the tenth point of the sixth bottom edge intersect each other to form a fourth base point, and a zone formed by connecting the fourth base point, the ninth point and the tenth point is the at least one fourth anti-stress zone.

13. The semiconductor structure in accordance with claim 12, wherein the second protective layer comprises a first lateral wall, a fifth lateral wall and a third connection wall connected to the first lateral wall and the fifth lateral wall, the first lateral wall comprises a first top edge having an eleventh point, the fifth lateral wall comprises a third top edge having a twelfth point, the eleventh point and the ninth point are spaced apart by a fifth distance, the fifth distance is the shortest distance from the first top edge to the third bottom edge, the twelfth point and the tenth point are spaced apart by a sixth distance, the sixth distance is the shortest distance from the third top edge to the sixth bottom edge.

14. The semiconductor structure in accordance with claim 12, wherein the fourth base point and the ninth point are spaced apart by a ninth distance, the fourth base point and the tenth point are spaced apart by a tenth distance equal to the ninth distance.

15. The semiconductor structure in accordance with claim 12, wherein the fourth connection wall is a flat surface or an arc surface.

* * * * *